(12) United States Patent
Cai et al.

(10) Patent No.: US 12,135,354 B1
(45) Date of Patent: Nov. 5, 2024

(54) SERIAL TEST CIRCUIT FOR CONTROLLABLE CHIPLETS

(71) Applicants: Nanjing University Of Posts And Telecommunications, Jiangsu (CN); NANTONG INSTITUTE OF NANJING UNIVERSITY OF POSTS AND TELECOMMUNICATIONS CO., LTD., Jiangsu (CN)

(72) Inventors: Zhikuang Cai, Jiangsu (CN); Yunbo Wang, Jiangsu (CN); Jian Song, Jiangsu (CN); Guopeng Zhou, Jiangsu (CN); Jiafei Yao, Jiangsu (CN); Binbin Xu, Jiangsu (CN); Henglu Wang, Jiangsu (CN); Zixuan Wang, Jiangsu (CN); Yufeng Guo, Jiangsu (CN)

(73) Assignees: Nanjing University Of Posts And Telecommunications, Jiangsu (CN); NANTONG INSTITUTE OF NANJING UNIVERSITY OF POSTS AND TELECOMMUNICATIONS CO., LTD., Jiangsu (CN)

( * ) Notice: Subject to any disclaimer, the term of this patent is extended or adjusted under 35 U.S.C. 154(b) by 0 days.

(21) Appl. No.: 18/037,326

(22) PCT Filed: Jun. 20, 2022

(86) PCT No.: PCT/CN2022/099765
§ 371 (c)(1),
(2) Date: May 17, 2023

(87) PCT Pub. No.: WO2023/212998
PCT Pub. Date: Nov. 9, 2023

(30) Foreign Application Priority Data

May 6, 2022 (CN) .......................... 202210485039.1

(51) Int. Cl.
*G01R 31/3185* (2006.01)
*G01R 31/317* (2006.01)

(52) U.S. Cl.
CPC ................ *G01R 31/318597* (2013.01); *G01R 31/31725* (2013.01)

(58) Field of Classification Search
CPC ...... G01R 31/318597; G01R 31/31725; G01R 31/31702
(Continued)

(56) References Cited

U.S. PATENT DOCUMENTS 6,185,711 B1 * 2/2001 Leung .............. G01R 31/31725 714/724
2002/0035442 A1 * 3/2002 Dervisoglu .... G01R 31/318536 702/120
(Continued)

FOREIGN PATENT DOCUMENTS

| CN | 207965049 | 10/2018 |
|---|---|---|
| CN | 112595966 | 4/2021 |
| CN | 112667557 | 4/2021 |
| CN | 114578217 | 6/2022 |

OTHER PUBLICATIONS

"International Search Report (Form PCT/ISA/210) of PCT/CN2022/099765", mailed on Dec. 15, 2022, pp. 1-5.

*Primary Examiner* — Tung X Nguyen
*Assistant Examiner* — Robert P Alejnikov, Jr.
(74) *Attorney, Agent, or Firm* — JCIPRNET (57) ABSTRACT

Disclosed is a serial test circuit for controllable Chiplets, which belongs to the technical field of test or measurement of semiconductor devices during manufacturing or processing. The test circuit includes a master control test module, a slave control test module, a clock controlling module and an outputting module. The master control test module is composed of a test access port module, a segment insertion bit (Continued)

module and a test data register module. The test controlling signal is generated by the master control test module, and the test inputting signals of the slave Chiplets are respectively controlled by the slave control test module after receiving the test controlling signal. At the same time, the test controlling signal is inputted to the clock controlling module to obtain the clock signals of the slave Chiplets. The output signal of the test outputting module is determined by the test controlling signal.

10 Claims, 7 Drawing Sheets

(58) Field of Classification Search
USPC .................................................. 324/762.01
See application file for complete search history.

(56) References Cited

U.S. PATENT DOCUMENTS

| | | | |
|---|---|---|---|
| 2012/0158347 A1* | 6/2012 | Noda | G11C 29/023 702/123 |
| 2014/0331099 A1* | 11/2014 | Wong | G01R 31/318547 714/733 |
| 2016/0109519 A1* | 4/2016 | Vadhavania | G01R 31/31726 714/731 |
| 2021/0333326 A1* | 10/2021 | Wang | G01R 31/31855 |
| 2022/0138387 A1* | 5/2022 | Narayanun | G06F 30/394 716/103 |
| 2023/0324812 A1* | 10/2023 | Whetsel | G01R 31/31725 355/53 |

* cited by examiner

SERIAL TEST CIRCUIT FOR CONTROLLABLE CHIPLETS

CROSS-REFERENCE TO RELATED APPLICATION

This application is a 371 application of the International PCT application serial no. PCT/CN2022/099765, filed on Jun. 20, 2022, which claims the priority benefit of China application serial no. 202210485039.1, filed on May 6, 2022. The entirety of each of the above mentioned patent applications is hereby incorporated by reference herein and made a part of this specification.

TECHNICAL FIELD

The present disclosure relates to the test technology for ultra large scale digital integrated circuits, in particular to a serial test circuit for controllable Chiplets, which belongs to the technical field of test or measurement of semiconductor devices during manufacturing or processing.

RELATED ART

Since Gordon Moore proposed that the number of transistors integrated on a semiconductor chip doubles every 18 to 24 months, microelectronic-related technologies such as integrated circuit manufacturing technology, packaging and test technology, design methodology and EDA tools has maintained a rapid development following the pace of Moore's Law in the past 50 years and entered the 7 nm process in 2019. Chips have experienced the development stage from small scale integrated circuit, medium scale integrated circuit, large scale integrated circuit, super large scale integrated circuit to ultra large scale integrated circuit, and the largest scale integrated circuit. After the semiconductor process enters the 28 nm process node, the research and development costs of new process are increasing exponentially, making it increasingly difficult to improve chip technology, so the design on system-on-chip SoC faces many challenges. Heterogeneous integration has stimulated the development of multi-chip package/multi-chip module, which is expected to create new industrial ecosystems sand new business models on the basis of the current chip industry.

Under the above background, the Chiplet integration technology has received widespread attentions as the key technology to solve the above problems. Chip technology tries to integrate a plurality of modular chips into one package through the internal interconnection technology to form heterogeneous chips with special functions, thereby solving the problems of scale, development cost and cost shortening cycle time involved in the chip development. By adopting advanced packaging technologies such as 2.5D and 3D, the chips can implement the high-performance multi-Chiplet on-chip interconnection, improve the integration of the chip system, and expand its performance and power consumption optimization space. In addition, the modular integration method is capable of validly improving the speed of chip research and development, reducing the research and development costs as well as the chip development barriers, and focusing on the chip research and development algorithm as well as the Chiplet technology to improve the overall innovation level and ability of the industry. According to the above integration way, testability design is an obvious challenge. When a plurality of Chiplets are integrated into the chip, the chip is not capable of packaging all the pins of the Chiplet, which greatly increases the requirement on the number of ports, so how to test more Chiplets with fewer test ports is an obvious challenge. When a faulty Chiplet exists after a plurality of Chiplets are integrated, the interconnections between the Chiplets may cause the entire chip to become unavailable. Therefore, it is necessary to seek a valid test method that is capable of efficiently testing the integrated Chiplet and guaranteeing the independence between the Chiplets, which will greatly reduce the cost of the entire chip.

Build-in Self Test (BIST) technology is a technology that implanting relevant functional circuits into the circuit during design to provide the self-test function, so as to reduce the dependence of device test on Automatic Test Equipment (ATE). The existing BIST technology focuses on a single Chiplet for built-in self-test. For the ultra large scale integrated circuits with a plurality of Chiplets integrated, the independent test of each Chiplet by BIST technology requires all pins of each Chiplet to be extracted. However, the number of packaging ports remaining after the integration of a plurality of Chiplets is limited. Therefore, the present disclosure aims to present a serial test circuit based on a master-slave architecture to implement a built-in self-test in a multiple-Chiplet integrated circuit.

SUMMARY OF INVENTION

The objectives of the present disclosure are to provide a serial test circuit for controllable Chiplets in view of the deficiencies in the above background to realize the invention objective of independent tests for a plurality of Chiplets, and solve the technical problem that the limited number of package ports left after integrating a plurality of Chiplets into the chip is insufficient to ensure the independent test of each Chiplet.

The following technical solutions are provided in the present disclosure to realize the above invention objectives.

A serial test circuit for controllable Chiplets includes a master Chiplet, three slave Chiplets, a slave control test module, a clock controlling module and a test outputting module, wherein control signals sel1/sel2/sel3 are generated by a master control test module in the master Chiplet, the control signals sel1/sel2/sel3 are inputted to the slave control test module, the clock controlling module and the test outputting module respectively.

The master control test module is configured to receive test data inputting signals, test mode selecting signals, clock signals and reset controlling signals from a port of a chip JTAG, capture, shift and update test inputting signals, and output a test control signal that only starts a test for one slave Chiplet to a slave control test module, to generate a confirmation signal generated by the test control signal, the confirmation signal generated by the test control signal is configured to stop a shifting operation on the test inputting signals. The master Chiplet includes the master control test module, and the master control test module is composed of three parts of a test access port module, a segment insertion bit module and a test data register module. The test access port module controls the turning-on of the segment insertion bit module, the segment insertion bit module further controls the dynamic configuration of the test data register module, and eventually implement the outputs of sel1/sel2/sel3. Only one signal of sel1/sel2/sel3 is capable of being a high level at the same time. When it is a high level, the corresponding slave Chiplet test is valid; when it is a low level, the corresponding slave Chiplet test is invalid, to implement the serial test. A test mode of the master Chiplet is entered when the sel1/sel2/sel3 are set to the low level simultaneously, and the master Chiplet is tested by using the data from the chip JTAG.

The slave control test module is configured to receive the test control signal outputted by the master control test module, receive the test data inputting signals, the test mode selecting signals, the clock signals and the reset controlling signals from the port of the chip JTAG, start and disable the test data inputting signals, the test mode selecting signals, the clock signals and the reset controlling signals from the port of the chip JTAG according to the test control signal, generate a test signal of each slave Chiplet and then transmit the test signal to each slave Chiplet, and a test state of master Chiplet test is entered when the test control signal that only starts a test for one slave Chiplet is set to 0. The test inputting signals of the three slave Chiplets are generated by the slave control test module, which are signal jtag1, signal jtag2, and signal jtag3 respectively. jtag1 is transmitted to slave Chiplet1, jtag2 is transmitted to slave Chiplet2, and jtag3 is transmitted to slave Chiplet3. The clock signals of the three slave Chiplet are generated by the clock controlling module, which are signal clk1, signal clk2, signal clk3 respectively, clk1 is transmitted to slave Chiplet1, clk2 is transmitted to slave Chiplet2, and clk3 is transmitted to slave Chiplet3.

The clock controlling module is configured to receive the test control signal outputted by the master control test module, receive functional clock signals inputted from outside, start and disable the functional clock signals inputted from outside according to the test control signal, generate clock signals of each slave Chiplet and then output the clock signals to each slave Chiplet.

The outputting module is configured to receive the test control signal outputted by the master control test module, select a test response signal fed back by the slave Chiplet or a test response signal fed back by the master Chiplet started by the test control singal, and then transmit to an output port of the chip JTAG. The output of the entire test circuit is controlled by the output module, the circuit is composed of three multiplexers, and the controlling signals are sel1/sel2/sel3. When sel1 is valid, test output signal tdo1 is transmitted from the slave Chiplet1 to tdo port; when sel2 is valid, test output signal tdo2 from the slave Chiplet12 is transmitted to the tdo port; when sel3 is valid, test output signal tdo3 from the slave Chiplet3 is transmitted to the tdo port. When sel1, sel2, sel3 are invalid, test output signal tdo0 from the master Chiplet is transmitted to the tdo port.

Further, in the serial test circuit for controllable Chiplets, the master control test module includes as follows.

A test access port unit is configured to receive the test data inputting signals, the test mode selecting signals, the clock signals and the reset controlling signals from the port of the chip JTAG, output control signals of starting a segment insertion bit unit, and outputting reset signals, data capturing enable signals, data shifting enable signals and data updating enable signals.

The segment insertion bit unit is configured to receive the test data inputting signals and the clock signals from the port of the chip JTAG, receive the control signals of starting the segment insertion bit unit, the reset signals, the data capturing enable signals, the data shifting enable signals and the data updating enable signals outputted by the test access port unit, and receive the confirmation signal generated by the test control signal outputted by a test data register unit, enter a starting state when receiving the control signal of starting the segment insertion bit unit, enter a data capturing state when receiving the data capturing enable signals, enter a data shifting state when receiving the data shifting enable signals and performs a shift operation on the test data inputting signals from the port of the chip JTAG to obtain the segment insertion bit value, enter a data update state when receiving the data updating enable signals and output an enable signal of the test data register unit after updating the segment insertion bit value, and turn off the segment insertion bit unit when the confirmation signal generated by the test control signal jumps to a low level and then entering a turning-off state.

The test data register unit is configured to receive the test data inputting signals and the clock signals from the port of the chip JTAG, receive the reset signals, the data capturing enable signals, the data shifting enable signals and the data updating enable signals outputted by the test access port unit, receive the enable signal of the test data register unit outputted by the segment insertion bit unit, enter an enable state when receiving the enable signal of the test data register unit, enter a data capturing state when receiving the data capturing enable signals, enter a data shifting state when receiving the data shifting enable signals and performs a shift operation on the test data inputting signals from the port of the chip JTAG, enter a data update state when receiving the data updating enable signals and update the data after the shift operation, output the test control signal that only starts the test for one slave Chiplet to the slave control test module, output the confirmation signal generated by the test control signal to the segment insertion bit unit, and set the confirmation signal generated by the test control signal to a low level when completing the shift operation.

Further, in the serial test circuit for controllable Chiplets, the test access port unit is transferred between a starting state, a data capturing state, a data shifting state, and a data update state through a TAP state machine; the test access port unit controls the test data register unit to transfer between the data capturing state, the data shifting state, and the data update state through the TAP state machine.

Further, in the serial test circuit for controllable Chiplets, a circuit for generating the enable signals of the test data register unit includes as follows.

A first AND gate, with an input terminal connected to the control signals of starting the segment insertion bit unit and another input terminal connected to the data updating enable signals outputted by the test access port module, is configured to output an enable signal of a first trigger.

The first trigger, with a data input terminal connected to the segment insertion bit value, a clock signal input terminal connected to the clock signals from the port of the chip JTAG, an enable terminal connected to the enable signal outputted by the first trigger, and a reset terminal connected to the reset signals outputted by the test access port unit, is configured to transmit the segment insertion bit value to a second trigger when the data updating enable signals are at a high level.

The second trigger, with a data input terminal connected to an output terminal of the first trigger, a clock signal input terminal connected to the clock signals from the port of the chip JTAG, and a reset terminal connected to the reset signals outputted by the test access port unit, is configured to output an output signal of the first trigger after delay processing.

A second AND gate, with an input terminal connected to an output terminal of the second trigger and another input terminal connected to the control signals of starting the segment insertion bit unit, is configured to output the enable signal of the test data register unit.

Further, in the serial test circuit for controllable Chiplets, the test data register unit includes as follows.

A third AND gate, with an input terminal connected to the enable signal of the test data register unit and another input terminal connected to the data capturing enable signals outputted by the test access port unit, is configured to output a control signal of a second alternative data selector.

A forth AND gate, with an input terminal connected to the enable signal of the test data register unit and another input terminal connected to the data shifting enable signals outputted by the test access port unit, is configured to output the control signal of a first alternative data selector.

The first alternative data selector, with an input terminal connected to a high-two digit signal outputted by a shift register group and another input terminal connected to the high-two digit signal outputted by the shift register group and the test data inputting signals from the port of the chip JTAG, is configured to transmit the test data inputting signal from the port of the chip JTAG to an input terminal of a second alternative data selector when the data shifting enable signals are valid.

The second alternative data selector, with an input terminal connected to an output terminal of the first alternative data selector and another input terminal connected to a preset signal, is configured to capture the preset signal when the data capturing enable signals are valid, and transmit the test data inputting signal from the port of the chip JTAG to the shift register group when the data shifting enable signals are valid.

The shift register group, with an input terminal connected to an output terminal of the second alternative data selector, is configured to shift the test data inputting signal from the port of the chip JTAG when the data shifting enable signals are valid and output data after the shifting operation.

A fifth AND gate, with an input terminal connected to the enable signal of the test data register unit and another input terminal connected to the data updating enable signal outputted by the test access port unit, is configured to output an enable signal of a trigger group when the data updating enable signals are valid.

The trigger group, with an input terminal connected to an output terminal of the shift register group and an enable terminal connected to an output terminal of the fifth AND gate, is configured to output the test control signal that only starts the test for one slave Chiplet when the data updating enable signals are valid.

A third trigger, with an input terminal connected to the output terminal of the shift register group, is configured to output the confirmation signal generated by the test control signal when a clock edge is valid and set the confirmation signal generated by the test control signal to a low level when completing the shifting operation.

Further, in the serial test circuit for controllable Chiplets, the slave control test module includes AND gates having the same number with the slave Chiplets, an input terminal of each of the AND gates is configured to receive the test data inputting signals, the test mode selecting signals, the clock signals and the reset controlling signals from the port of the chip JTAG, and another input terminal of each AND gates is connected to the test control signal output by the master control test module, each AND gate is configured to output the test signals of each slave Chiplet.

Further, in the serial test circuit for controllable Chiplets, the clock controlling module includes AND gates having the same number with the slave Chiplets, an input terminal of each AND gate is configured to receive functional clock signals inputted from outside, another input terminal of each AND gate is connected to the test control signal outputted by the master control test module, and each AND gate is configured to output the clock signals of each slave Chiplet.

Further, in the serial test circuit for controllable Chiplets, the master control test module is built in the master Chiplet.

Further, in the serial test circuit for controllable Chiplets, the bit of the shift register group and the bit of the trigger group in the test data register unit are set according to the number of the slave Chiplets.

Further, in the serial test circuit for controllable Chiplets, a plurality of rounds of tests are conducted on the multi-Chiplet integrated circuit, when the test response signal fed back by the slave Chiplet received from a previous round of test indicates a fault of the slave Chiplet, a slave Chiplet is selected from the slave Chiplets after eliminating faults as a test object in the subsequent round of test, and a test is started at the selected test object by using a test control signal generated in the subsequent round of test.

The above technical solutions adopted in the present disclosure have the following beneficial effects.

(1) The serial test circuit for controllable Chiplets provided in the present disclosure, adopts a master-slave control architecture, generates controlling signals for each slave Chiplet to carry out built-in self-test respectively through the master control test module, and is capable of testing all Chiplets integrated on the circuit one by one with only 5 JTAG ports, thereby greatly reducing the number of test ports.

(2) In the serial test circuit for controllable Chiplets provided in the present disclosure, the segment insertion bit module in the master control test module is only equivalent to a switch. When the switch is turned on, the shifting operation on the input test data is ensured, when the whole shift operation is completed, the segment insertion bit module is turned off to ensure the internal value for the test data register remains unchanged, and to prevent the clock reversal of the test data register, thereby saving the power consumption of the test data register. The test data register module in the master control test module has a high degree of flexible scalability and configurability, the test control signals that match the number of Chiplet integrations are capable of being obtained simply by increasing the bit width of the test data register module.

(3) In the serial test circuit for controllable Chiplets provided in the present disclosure, the generated test control signals cause only one Chiplet to enter a built-in self-test state, while turning off the clock signals of other Chiplets to implement the independence of the Chiplet test, ensuring that the Chiplet test does not affect each other; shield the untested Chiplet clock signal, test mode selecting signal, reset controlling signal, and test data inputting signal, thereby saving the test power consumption and reducing the test time.

BRIEF DESCRIPTION OF DRAWINGS

FIG. 6(*a*) illustrates a test simulation diagram of the enable signal of the test data register module in the present disclosure, FIG. 6(*b*) illustrates a test simulation diagram of output signals of the test data register module in the present disclosure, FIG. 6(*c*) illustrates a test simulation diagram of a slave Chiplet1.

DESCRIPTION OF EMBODIMENTS

In order to deepen the understanding on the present disclosure, the following will further describe the present disclosure in details. The embodiments described below are only used to illustrate the present disclosure and do not to limit the protection scope of the present disclosure.

As illustrated in FIG. 1 to FIG. 5, provided in the present disclosure is a method for designing a serial test circuit for controllable Chiplets.

Figure 1:
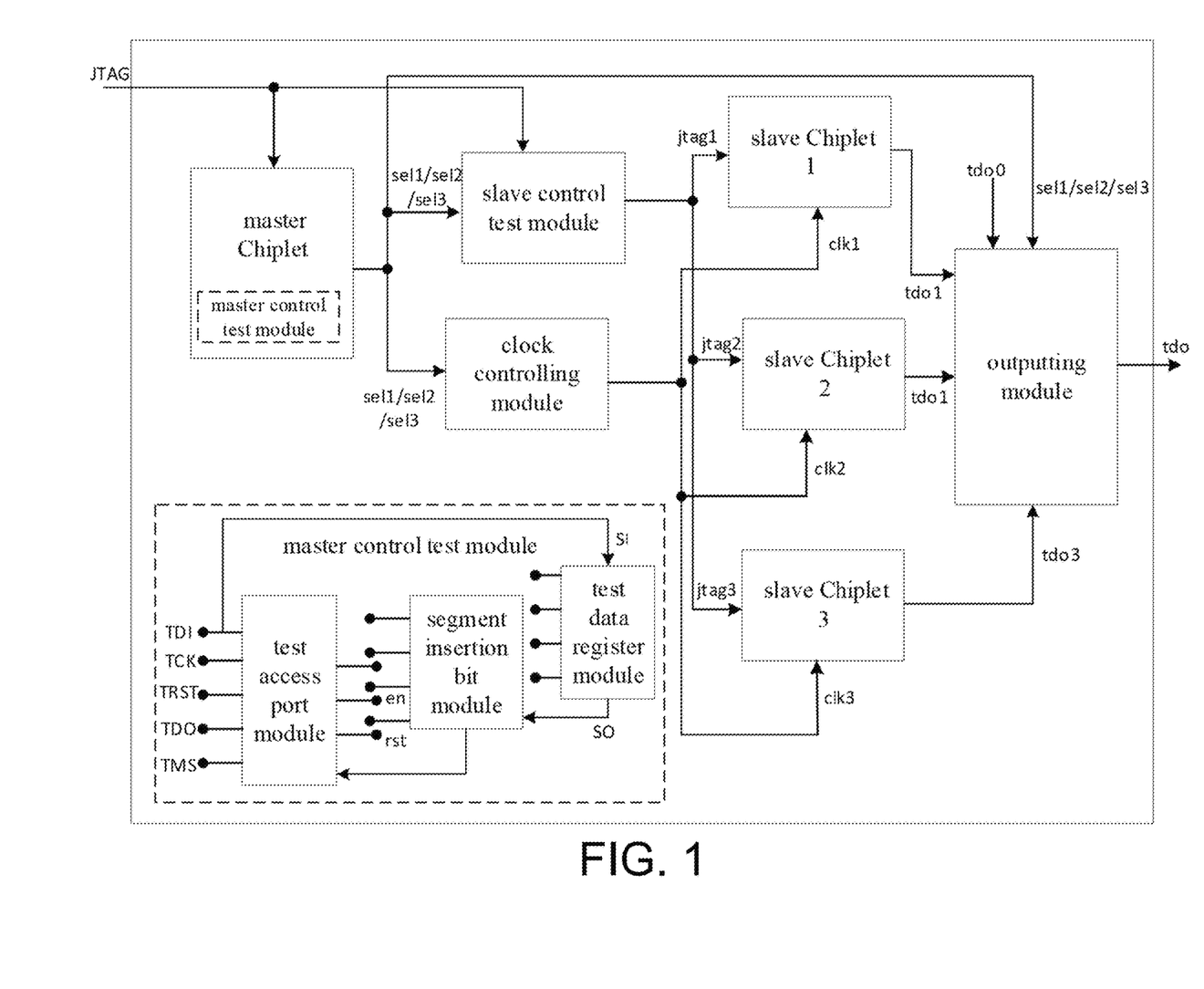
FIG. 1 illustrates a diagram of an overall test circuit in the present disclosure.

FIG. 1 illustrates a diagram of an overall test circuit in the present embodiment. As illustrated in FIG. 1, the whole integrated chip includes a master Chiplet, three slave Chiplets, a slave control test module, a clock controlling module and an outputting module. Controlling signals sel1/sel2/sel3 are generated by a master control test module in the master Chiplet, the controlling signals sel1/sel2/sel3 are input to the slave control test module, the clock controlling module and the outputting module respectively. Only one of sel1, sel2 and sel3 is a valid high level, when sel1, sel2, sel3 are all invalid low levels, the master Chiplet is tested by using the data input from the port of the chip JTAG.

Figure 2:
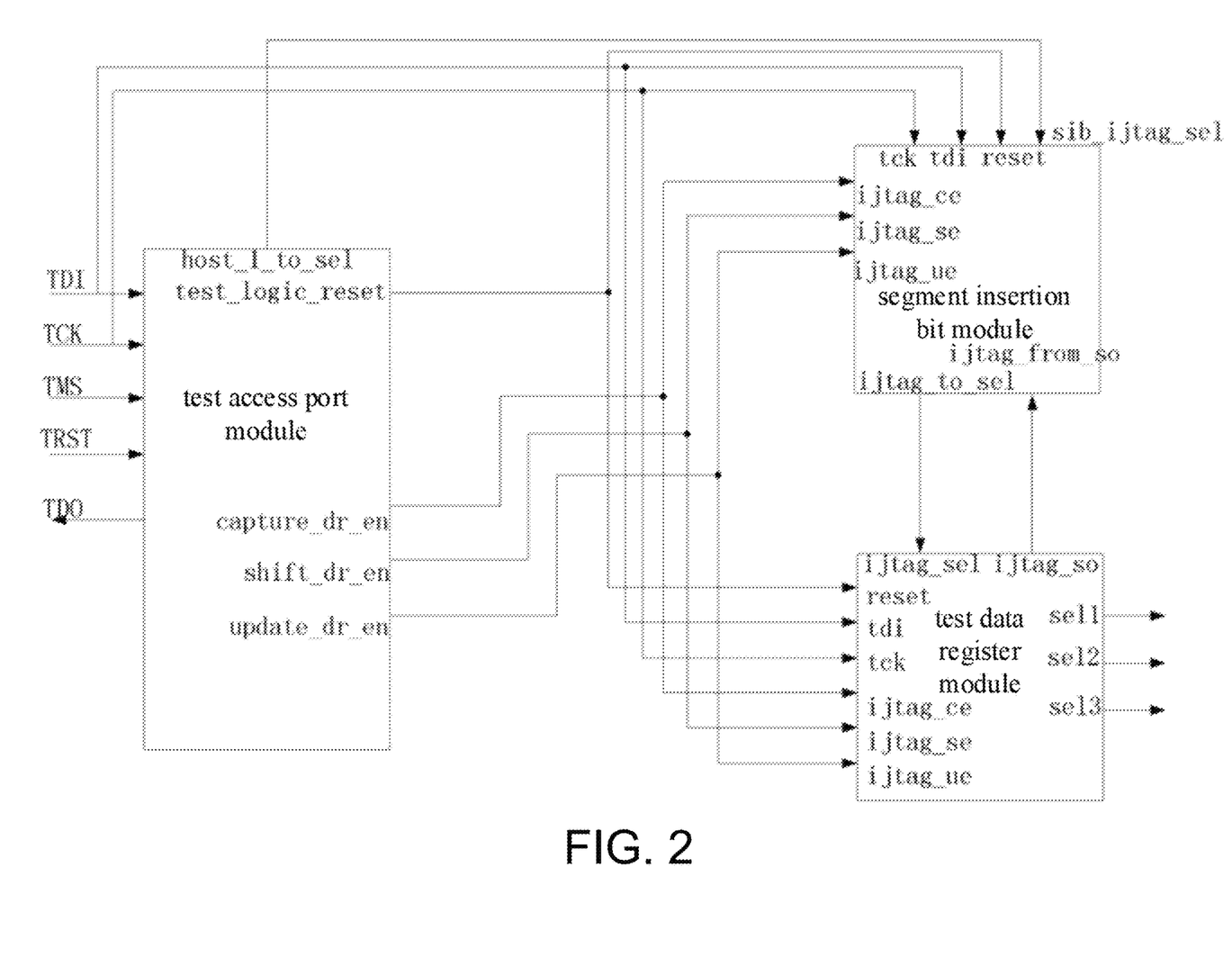
FIG. 2 illustrates a circuit diagram of a master control test module in the present disclosure.

FIG. 2 illustrates a diagram of a master control test module in the present embodiment. The entire circuit is composed of a test access port module, a segment insertion bit module and a test data register module. The signal connection relationship of each part in FIG. 2 is that: the test access port module is connected to the chip port JTAG, from which a test data inputting signal TDI, a test mode selecting signal TMS, a clock signal TCK and a reset controlling signal TRST are received, and a confirmation signal TDO generated by test control signal fed back by the test data register module is transmitted to the chip port JTAG. The test data inputting signal TDI and the clock signal TCK are respectively sent to the tck port and tdi port of the segment insertion bit module, and the test data inputting signal TDI and the clock signal TCK are respectively sent to the tdi port and tck port of the test data register module. The starting control signal of the segment insertion bit module is outputted from the port of host_1_to_sel in the test access port module to the port of sib_ijtag_sel in segment insertion bit module. The reset signal is outputted from the port of the test_logic_reset in the test access port module to a reset port of the segment insertion bit module and a reset port of the test data register module. The data capturing enable signal is outputted from the port of the capture_dr_en in the test access port module to the port of ijtag_ce in the segment insertion bit module and the port of ijtag_ce in the test data register module. The data shifting enable signal is outputted from the port of shift_dr_en in the test access port module to the port of ijtag_se in the segment insertion bit module and the port of ijtag_se in the test data register module. The data updating enable signal is outputted from the port of update_dr_en in the test access port module to the port of ijtag_ue in the segment insertion bit module and the port of ijtag_ue in the test data register module. The enable signal in the test data register module is outputted from the port of ijtag_to_sel in the segment insertion bit module to the port of ijtag_sel in the test data register module. The confirmation signal generated by the test control signal is outputted from the port of ijtag_so in the test data register module to the port of ijtag_from_so in the segment insertion bit module, the confirmation signal generated by the test control signal is set to be a low level when the whole shift operation is completed, and the segment insertion bit module turns off the enable signal inputting terminal in the test data register module when detecting that the confirmation signal generated by the test control signal has become a low level.

Figure 3:
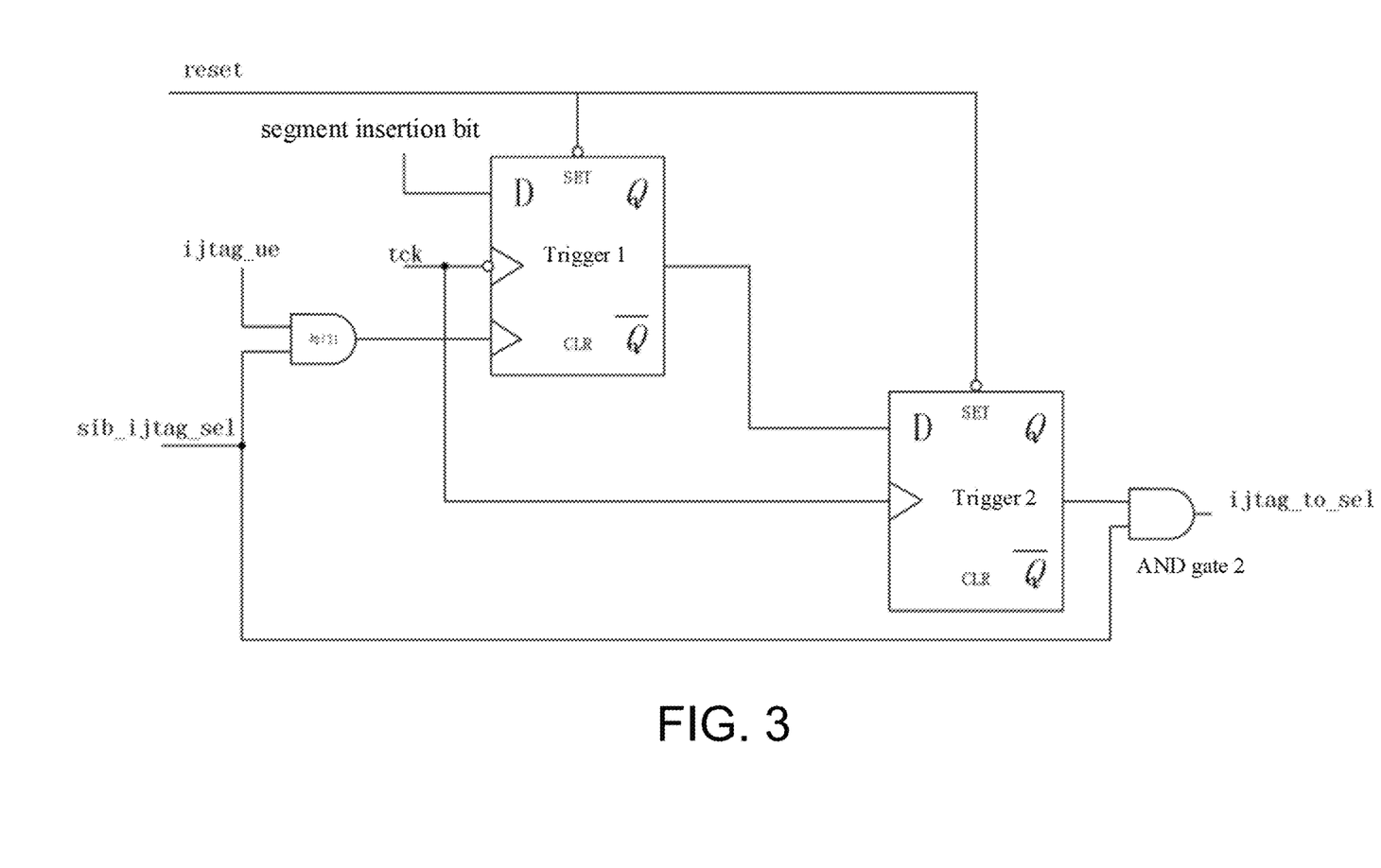
FIG. 3 illustrates a circuit diagram generated by an enable signal of a test data register module in the present disclosure.

The configuration principle of the master control test module circuit illustrated in FIG. 2 is that: the instruction starting signal host_1_to_sel (that is, sib_ijtag_sel in the segment insertion bit module) is controlled by the test access port module through an internal state device, after the segment insertion bit module receives the enable signal sib_ijtag_sel, a data operation of segment insertion bit is started. When the test access port module enters the data capturing state, the segment insertion bit module enters the data capturing state. When the test access port module enters the data shifting state, the high level input from the port of tdi is shifted to obtain the segment insertion bit value, and the segment insertion bit value is inputted to the data inputting terminal of trigger 1. The generation circuit of ijtag_to_sel signal (that is ijtag_sel in the test data register module) of the segment insertion bit module is as illustrated in FIG. 3. The data updating enable signal ijtag_ue in the segment insertion bit module and the starting control signal sib_ijtag_sel in the segment insertion bit module perform logical calculations through the AND gate 1 and the output of the AND gate 1 is taken as the enable control signal of trigger 1. When the clock edge arrives and the circuit enable control signal is a high level, the segment insertion bit value is transmitted to the output terminal of the trigger 1, the output of the trigger 1 performs calculations with sib_ijtag_sel after 1-bit delay of trigger 2, the ijtag_to_sel signal is obtained after the output of trigger 2 performs logic calculations with sib_ijtag_sel through gate 2, and the ijtag_to_sel signal is the enable signal of the segment insertion bit module to control the test data register module.

Figure 4:
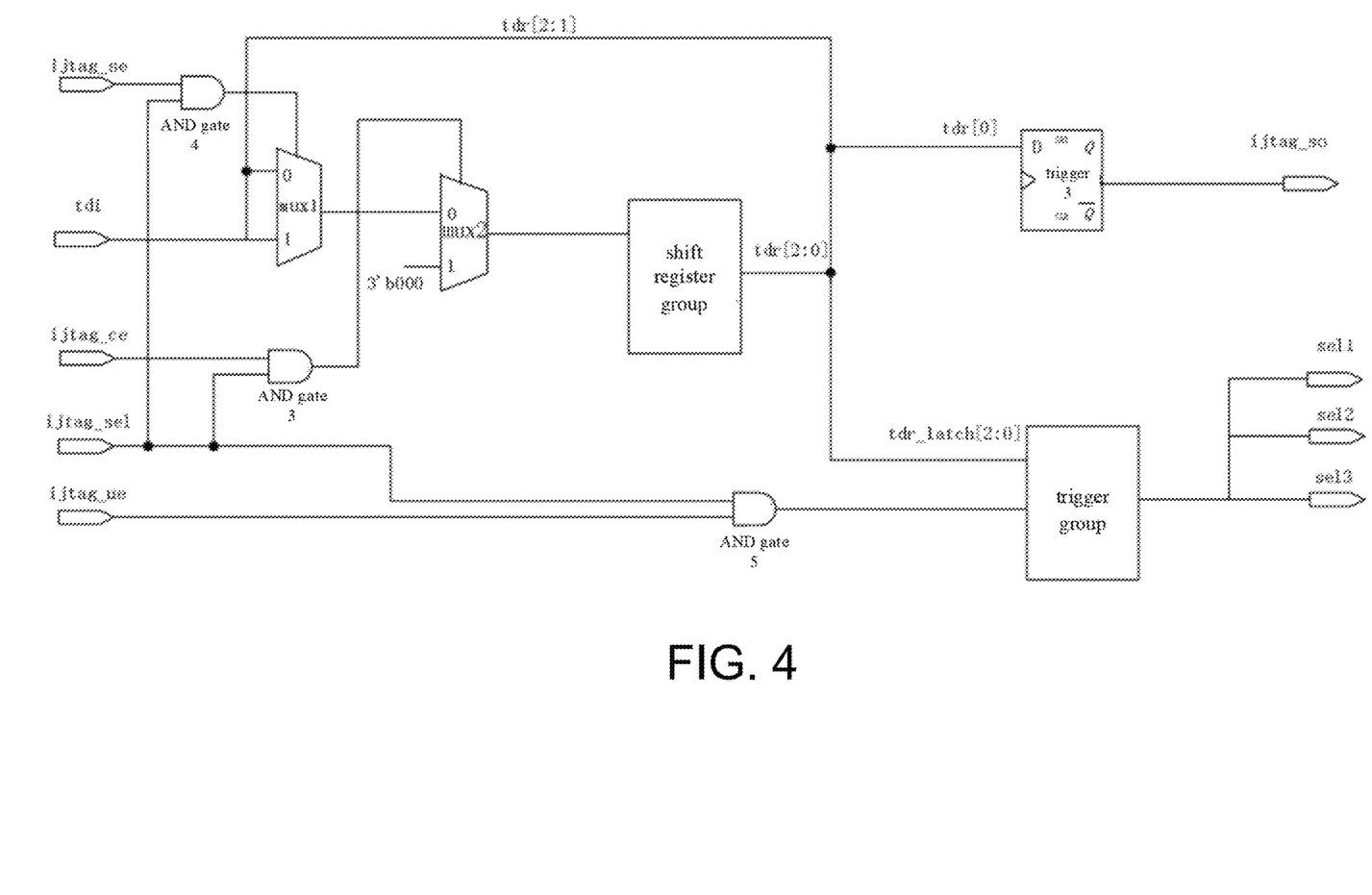
FIG. 4 illustrates a schematic diagram of the test data register module in the present disclosure.

The circuit of the test data register module is as illustrated in FIG. 4. When the test access port module enters the data capturing state, that is, ijtag_ce=1, then AND gate 3 outputs a high level, test data register module starts to capture data, and 3' b000 is sent to the shift register by mux2, where 3' b000 is a preset value. When the test access port module enters the data shifting state, that is, ijtag_se=1, then AND gate 4 outputs a high level, the 0 terminal and 1 terminal of mux1 are connected to the output terminal of the shift register group tdr [2:1], and 1 terminal of the mux11 is further connected to the tdi port. The data of the tdi port are transmitted to the shift register group by the mux11. When the outputs of AND gate 3 and AND gate 4 both are at a low level, the value for the shift register is locked. When the test access port module enters the data updating state, that is, ijtag_ue=1, then AND gate 5 outputs a high level, and updates the value for the shift register to the trigger group, the outputs of the trigger group are sel1, sel2, sel3, the slave control test module, the outputting module and the clock controlling module are controlled by the three signals. An data inputting terminal of trigger 3 is connected to the outputting terminal of the shift register group, which is configured to observe the output data of the shift register group. When the shift register group outputs the data, trigger 3 outputs the confirmation signal ijtag_so generated by the test control signal. The confirmation signal ijtag_so generated by the test control signal is set to a low level when the shift operation is complete.

Figure 5:
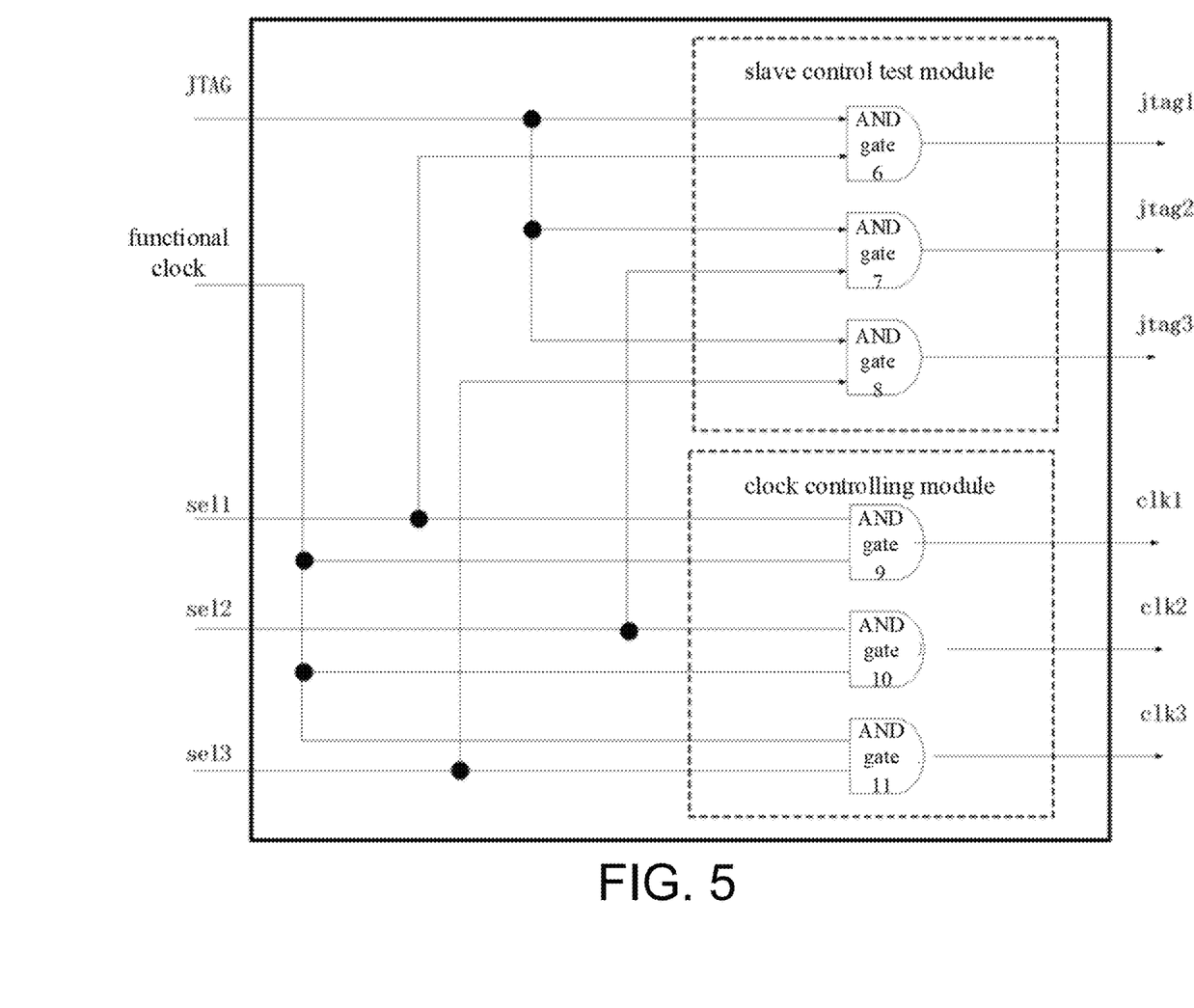
FIG. 5 illustrates a circuit diagram of a slave control test module and a clock controlling module in the present disclosure.

The slave control test module and the clock controlling module are as illustrated in FIG. 5. The inputting signals include: signals output from the port of the chip JTAG (the test data inputting signal TDI, the test mode selecting signal TMS, the clock signal TCK and the reset controlling signal TRST), the functional clock inputted from the outside port and the test control signals sel1/sel2/sel3 outputted by the master control test module. The port of the chip JTAG performs logical calculations with the test control signals sel1/sel2/sel3 respectively through AND gate 6, AND gate7 and AND gate 8, to generate signals jtag1, jtag2 and jtag3, and the functional clock performs logical calculations with the test control signals sel1/sel2/sel3 respectively through AND gate 9, AND gate 10 and AND gate 11, to generate signals clk1, clk2, clk3.

Figure 6A:
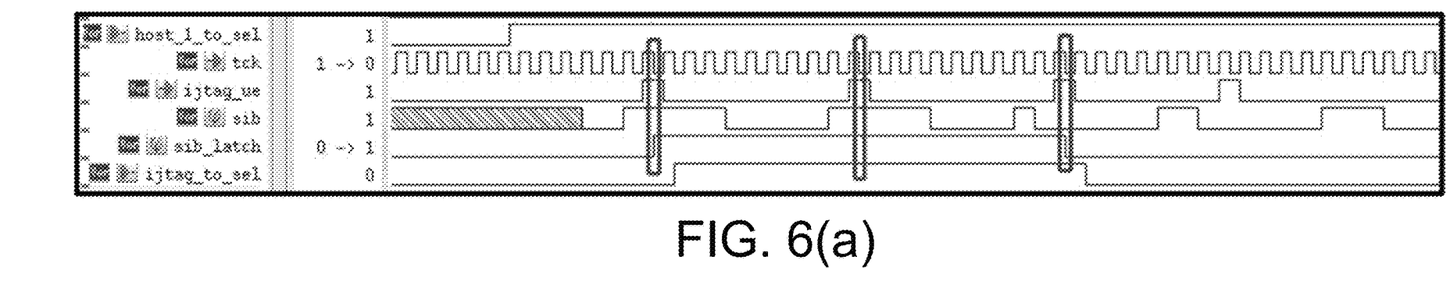
Figure 6B:
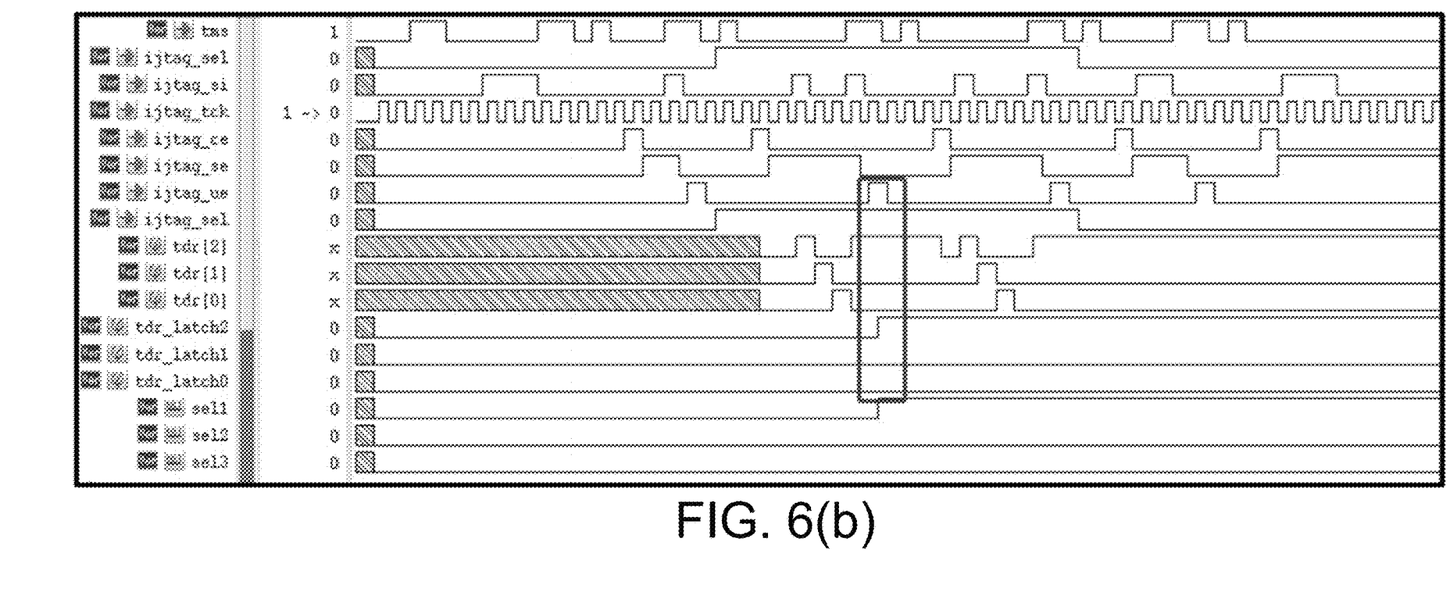
Figure 6C:
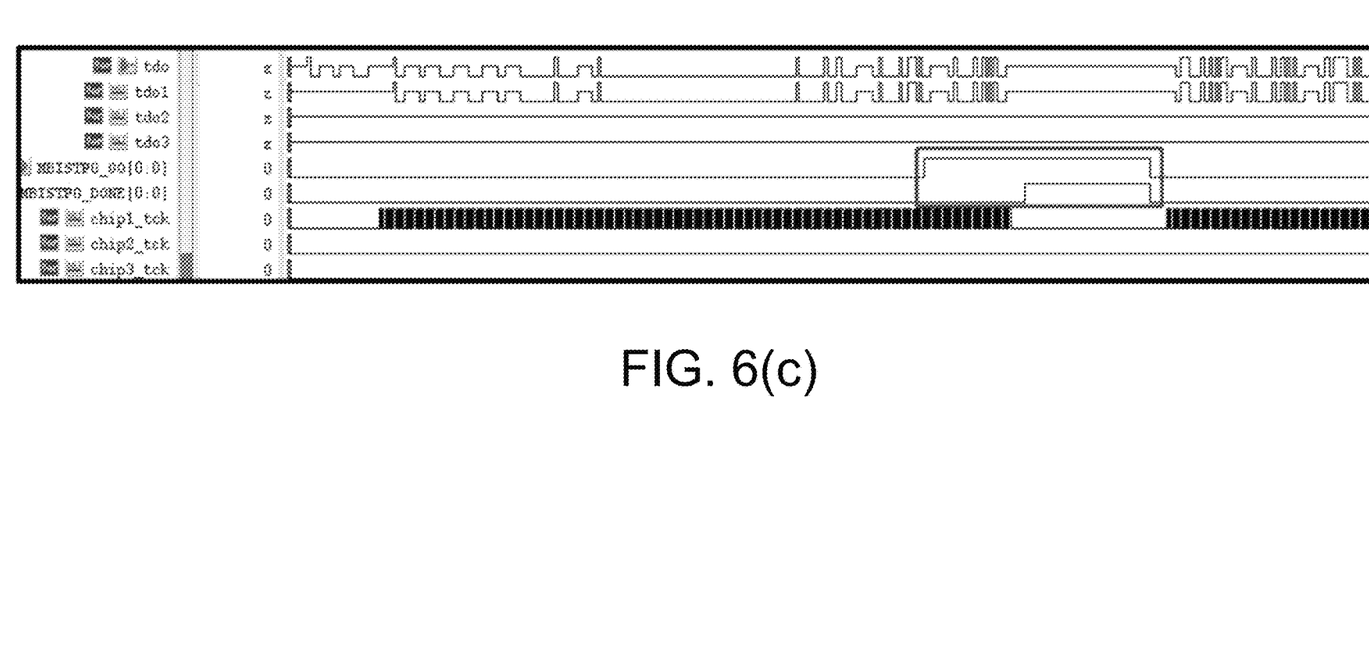

FIG. 6(*a*) illustrates a control waveform of the enable signal of the test data register module. As the enable signal in the test data register module, ijtag_to_sel is controlled by the segment insertion bit unit. Signals ijtag_ue and sib_ijtag_sel (that is, host_1_to_sel) are the enable signals of the trigger 1 in the FIG. 3. When enabling is turned on and clock ijtag_tck is at the falling edge, the value (sib) for the segment insertion bit module is transmitted to the trigger 1 (sib_latch) and then transmitted to ijtag_to_sel after a 1-bit delay as the enable signal in the test data register module. FIG. 6(*b*) illustrates a waveform of the output signal in the test data register module. When the enable signal ijtag_sel in the test data register module is a high level, shift operation is carried out through the test data register module, and 3' b100 is transmitted to the test data register module as illustrated in FIG. 6(*b*), to obtain tdr [2:0]=3' b100, namely {sel1, sel2, sel3}=3' b100, and then sel1, sel2, sel3 are used to control the slave control test module, the clock controlling module and the outputting module. FIG. 6(*c*) illustrates test results of the slave Chiplet1. When the slave Chiplet1 is tested, the whole circuit implements the clock disabling operation on slave Chiplet2 and slave Chiplet3. According to signals of MBISTPG_GO and MBISTPG_DONE of the slave Chiplet1, it is determined that a test operation of the slave Chiplet1 is completed and there is no failure.

The above embodiments are only illustrative descriptions on the present disclosure and do not limit its protection scope. Those skilled in the art can also make local modifications, for example, the serial test circuit for controllable Chiplets with the master-slave architecture can be composed of by the master control test module and the slave control test module with other structures, the enable signals in the test data register module can be generated by the specific circuit of other circuit structures, the test data inputting signals can be captured, shifted and updated by using the test data register module of other circuit structure. Any form of equivalent substitution that conforms to the objectives of present disclosure falls within the protection scope of the present disclosure.

What is claimed is:

1. A serial test circuit for controllable Chiplets, configured to test a multi-Chiplet integrated circuit including one master Chiplet and at least three slave Chiplets, the serial test circuit for controllable Chiplets comprises:

a master control test module, receives test data inputting signals, test mode selecting signals, clock signals and reset controlling signals from a port of a chip JTAG, captures, shifts and updates test inputting signals, and outputs a test control signal that only starts a test for one slave Chiplet to a slave control test module, generates a confirmation signal for the test control signal has been generated, wherein the confirmation signal for the test control signal has been generated is configured to stop a shifting operation on the test inputting signals, and enter a master Chiplet test state when the test control signal that only starts the test for one slave Chiplet is set to 0;

the slave control test module, receives the test control signal outputted by the master control test module, receives the test data inputting signals, the test mode selecting signals, the clock signals and the reset controlling signals from the port of the chip JTAG, starts and disables the test data inputting signals, the test mode selecting signals, the clock signals and the reset controlling signals from the port of the chip JTAG according to the test control signal, generates a test signal of each slave Chiplet and then transmits the test signal to each slave Chiplet;

a clock controlling module, receives the test control signal outputted by the master control test module, receives functional clock signals inputted from outside, starts and disables the functional clock signals inputted from outside according to the test control signal, generates clock signals of each slave Chiplet and then outputs the clock signals to each slave Chiplet; and an outputting module, receives the test control signal outputted by the master control test module, selects a test response signal fed back by the slave Chiplet or a test response signal fed back by the master Chiplet started by the test control signal, and then transmits to an output port of the chip JTAG.

2. The serial test circuit for controllable Chiplets according to claim 1, wherein the master control test module comprises:

a test access port unit, receives the test data inputting signals, the test mode selecting signals, the clock signals and the reset controlling signals from the port of the chip JTAG, outputs control signals of starting a segment insertion bit unit, outputting reset signals, data capturing enable signals, data shifting enable signals and data updating enable signals;

the segment insertion bit unit, receives the test data inputting signals and the clock signals from the port of the chip JTAG, receives the control signals of starting the segment insertion bit unit, the reset signals, the data capturing enable signals, the data shifting enable signals and the data updating enable signals outputted by the test access port unit, receives the confirmation signal for the test control signal has been generated outputted by a test data register unit, enters a starting state when receiving the control signals of starting the segment insertion bit unit, enters a data capturing state when receiving the data capturing enable signals, enters a data shifting state when receiving the data shifting enable signals and performs a shift operation on the test data inputting signals from the port of the chip JTAG to obtain a segment insertion bit value, enters a data update state when receiving the data updating enable signals and outputs an enable signal of the test data register unit after updating the segment insertion bit value, and turns off the segment insertion bit unit when the confirmation signal for the test control signal has been generated jumps to a low level and then turn off an enable control signal of the test data register unit; and the test data register unit, receives the test data inputting signals and the clock signals from the port of the chip JTAG, receives the reset signals, the data capturing enable signals, the data shifting enable signals and the data updating enable signals outputted by the test access port unit, receives the enable signal of the test data register unit outputted by the segment insertion bit unit, enters an enable state when receiving the enable signal of the test data register unit, enters a data capturing state when receiving the data capturing enable signals, enters a data shifting state when receiving the data shifting enable signals and performs a shift operation on the test data inputting signals from the port of the chip JTAG, enters a data update state when receiving the data updating enable signals and updates data after the shift operation, outputs the test control signal that only starts the test for one slave Chiplet to the slave control test module, outputs the confirmation signal for the test control signal has been generated to the segment insertion bit unit, and set the confirmation signal for the test control signal has been generated to a low level when completing the shift operation.

3. The serial test circuit for controllable Chiplets according to claim 2, wherein the test access port unit controls the segment insertion bit unit to be transferred between a starting state, a data capturing state, a data shifting state, and a data update state through a TAP state machine; the test access port unit controls the test data register unit to be transferred between the data capturing state, the data shifting state, and the data update state through the TAP state machine.

4. The serial test circuit for controllable Chiplets according to claim 2, wherein a circuit for generating the enable signal of the test data register unit comprises:
a first AND gate, with an input terminal receives the control signals of starting the segment insertion bit unit and another input terminal receives the data updating enable signals outputted by the test access port unit, outputs an enable signal of a first trigger;
the first trigger, with a data input terminal receives the segment insertion bit value, a clock signal input terminal receives the clock signals from the port of the chip JTAG, an enable terminal receives the enable signal outputted by the first trigger, and a reset terminal receives the reset signals outputted by the test access port unit, transmits the segment insertion bit value to a second trigger when the data updating enable signals are at a high level;
the second trigger, with a data input terminal connected to an output terminal of the first trigger, a clock signal input terminal receives the clock signals from the port of the chip JTAG, and a reset terminal receives the reset signals outputted by the test access port unit, outputs an output signal of the first trigger after delay processing, and
a second AND gate, with an input terminal connected to an output terminal of the second trigger and another input terminal receives the control signals of starting the segment insertion bit unit, outputs the enable signal of the test data register unit.

5. The serial test circuit for controllable Chiplets according to claim 2, wherein the test data register unit comprises:
a third AND gate, with an input terminal receives the enable signal of the test data register unit and another input terminal receives the data capturing enable signals outputted by the test access port unit, outputs a control signal of a second alternative data selector;
a forth AND gate, with an input terminal receives the enable signal of the test data register unit and another input terminal receives the data shifting enable signals outputted by the test access port unit, outputs a control signal of a first alternative data selector;
the first alternative data selector, with an input terminal receives a high-two digit signal outputted by a shift register group and another input terminal receives the high-two digit signal outputted by the shift register group and the test data inputting signals from the port of the chip JTAG, transmits the test data inputting signal from the port of the chip JTAG to an input terminal of a second alternative data selector when the data shifting enable signals are valid;
the second alternative data selector, with an input terminal connected to an output terminal of the first alternative data selector and another input terminal receives a preset signal, captures the preset signal when the data capturing enable signals are valid, and transmits the test data inputting signal from the port of the chip JTAG to the shift register group when the data shifting enable signals are valid;
the shift register group, with an input terminal connected to an output terminal of the second alternative data selector, shifts the test data inputting signal from the port of the chip JTAG when the data shifting enable signals are valid and outputs data after the shifting operation;
a fifth AND gate, with an input terminal receives the enable signal of the test data register unit and another input terminal receives the data updating enable signal outputted by the test access port unit, outputs an enable signal of a trigger group when the data updating enable signals are valid;
the trigger group, with an input terminal connected to an output terminal of the shift register group and an enable terminal connected to an output terminal of the fifth AND gate, outputs the test control signal that only starts the test for one slave Chiplet when the data updating enable signals are valid; and
a third trigger, with an input terminal connected to the output terminal of the shift register group, outputs the confirmation signal for the test control signal has been generated when a clock edge is valid and set the confirmation signal for the test control signal has been generated to a low level when completing the shifting operation.

6. The serial test circuit for controllable Chiplets according to claim 5, wherein bits of the shift register group and bits of the trigger group in the test data register unit are set according to a number of the slave Chiplets.

7. The serial test circuit for controllable Chiplets according to claim 1, wherein the slave control test module comprises AND gates having a same number with the slave Chiplets, an input terminal of each AND gate is received the test data inputting signals, the test mode selecting signals, the clock signals and the reset controlling signals inputted from the port of the chip JTAG, and another input terminal of each AND gate is received the test control signal outputted by the master control test module, each AND gate outputs the test signals of each slave Chiplet.

8. The serial test circuit for controllable Chiplets according to claim 1, wherein the clock controlling module comprises AND gates having the same number with the slave Chiplets, an input terminal of each AND gate is received the functional clock signals inputted from outside, another input terminal of each AND gate is received the test control signal outputted by the master control test module, and each AND gate is outputted the clock signals of each slave Chiplet.

9. The serial test circuit for controllable Chiplets according to claim 1, wherein the master control test module is built in the master Chiplet.

10. The serial test circuit for controllable Chiplets according to claim 1, wherein a plurality of rounds of tests are conducted on the multi-Chiplet integrated circuit, when the test response signal fed back by the slave Chiplet received from a previous round of test indicates a fault of the slave Chiplet, a slave Chiplet is selected from the slave Chiplets after eliminating faults as a test object in a subsequent round of test, and a test is started at the selected test object by using a test control signal generated in the subsequent round of test.

* * * * *